US006259036B1

(12) United States Patent
Farnworth

(10) Patent No.: US 6,259,036 B1
(45) Date of Patent: Jul. 10, 2001

(54) METHOD FOR FABRICATING ELECTRONIC ASSEMBLIES USING SEMI-CURED CONDUCTIVE ELASTOMERIC BUMPS

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/059,236

(22) Filed: Apr. 13, 1998

(51) Int. Cl.[7] ...................................................... H05K 1/11
(52) U.S. Cl. .......................... 174/260; 174/259; 361/772; 361/773; 361/774; 361/783; 257/737; 257/739; 257/778; 438/108; 438/119; 438/613; 438/665; 228/180.22; 228/187; 228/227; 228/229; 29/840; 29/841; 29/865
(58) Field of Search ...................................... 361/760, 772, 361/773, 774, 782, 783; 174/259, 260; 257/737–739, 778, 780, 781, 783; 438/108, 118, 119, 125, 613, 614, 652, 657, 660, 661, 665; 228/180.21, 180.22, 187, 227, 229; 29/832, 840, 841, 842, 844, 854, 855, 865

(56) References Cited

U.S. PATENT DOCUMENTS

| 3,767,519 | * | 10/1973 | Kojima et al. ........................ 257/739 |
| 4,237,216 | * | 12/1980 | Skarvinko ......................... 430/280.1 |
| 5,019,944 | * | 5/1991 | Ishii et al. ............................ 174/259 |
| 5,136,365 | | 8/1992 | Pennisi et al. ...................... 257/783 |
| 5,173,369 | * | 12/1992 | Kataoka ................................ 257/735 |
| 5,458,694 | | 10/1995 | Nuyen .................................. 136/249 |
| 5,474,620 | | 12/1995 | Nath et al. ........................... 136/251 |
| 5,484,648 | * | 1/1996 | Odashima et al. ................... 428/209 |
| 5,492,863 | * | 2/1996 | Higgins, III ........................ 438/613 |
| 5,559,444 | | 9/1996 | Farnworth et al. .................. 324/754 |
| 5,578,527 | | 11/1996 | Chang et al. ........................ 438/119 |
| 5,588,359 | | 12/1996 | Hofmann et al. ............... 101/128.21 |
| 5,604,445 | * | 2/1997 | Desai et al. .......................... 361/760 |
| 5,634,267 | | 6/1997 | Farnworth et al. .................... 29/840 |
| 5,661,042 | | 8/1997 | Fang et al. ............................. 438/17 |
| 5,668,059 | | 9/1997 | Christie et al. ...................... 438/118 |
| 5,674,780 | * | 10/1997 | Lytle et al. ........................... 438/613 |
| 5,709,336 | * | 1/1998 | Ingraham et al. .............. 228/180.22 |
| 5,789,278 | | 8/1998 | Akram et al. ....................... 438/118 |
| 5,813,870 | * | 9/1998 | Gaynes et al. ........................ 439/91 |
| 5,847,022 | * | 12/1998 | Yamashina et al. ................. 522/149 |
| 5,861,678 | | 1/1999 | Schrock .............................. 257/783 |
| 5,910,641 | * | 6/1999 | Gaynes et al. ...................... 174/259 |
| 5,931,371 | * | 8/1999 | Pao et al. ........................ 228/180.22 |
| 5,931,685 | * | 8/1999 | Hembree et al. ..................... 439/74 |
| 5,940,729 | * | 8/1999 | Downes, Jr. et al. ............... 438/613 |
| 5,977,642 | * | 11/1999 | Appelt et al. ....................... 257/780 |
| 5,990,566 | | 11/1999 | Farnworth et al. ................. 257/783 |
| 6,002,180 | | 12/1999 | Akram et al. ....................... 257/783 |
| 6,016,060 | | 1/2000 | Akram et al. ....................... 324/757 |
| 6,040,702 | | 3/2000 | Hembree et al. ................... 324/755 |
| 6,077,723 | | 6/2000 | Farnworth et al. ................. 438/107 |
| 6,097,087 | | 8/2000 | Farnworth et al. ................. 257/698 |
| 6,107,122 | | 8/2000 | Wood et al. ........................ 438/117 |

FOREIGN PATENT DOCUMENTS 01-198092 A * 8/1989 (JP) .
02-310532 A * 12/1990 (JP) .

* cited by examiner

Primary Examiner—Jeffrey Gaffin
Assistant Examiner—John B. Vigushin
(74) Attorney, Agent, or Firm—Stephen A. Gratton

(57) ABSTRACT

A method for fabricating bumped semiconductor components and electronic assemblies, such as multi chip modules, is provided. The method includes forming semi cured, electrically conductive, elastomeric bumps on electrodes of a semiconductor component (e.g., die, chip scale package), or on electrodes of a mating component (e.g., PCB, MCM substrate). The bumps include an adhesive matrix material and dendritic metal particles. The adhesive matrix material is in a semi cured condition having adhesive qualities for bonding, but with a structural rigidity for supporting the dendritic particles to enable penetration of oxide layers on the electrodes. The semi cured adhesive bumps permit the bumps to be cured without the necessity of externally generated compressive forces.

33 Claims, 3 Drawing Sheets

STEP A. PROVIDE A SEMICONDUCTOR COMPONENT SUCH AS A DIE, A WAFER OR A CHIP SCALE PACKAGE, HAVING ELECTRODES IN ELECTRICAL COMMUNICATION WITH INTEGRATED CIRCUITS.

STEP B. PROVIDE A MATING COMPONENT, SUCH AS A MULTI CHIP MODULE SUBSTRATE, OR A PRINTED CIRCUIT BOARD, HAVING MATING ELECTRODES.

STEP C. PROVIDE A CONDUCTIVE ELASTOMERIC MATERIAL COMPRISING AN ADHESIVE MATRIX MATERIAL, A DENDRITIC PARTICLE MATERIAL AND A SOLVENT.

STEP D. DEPOSIT THE CONDUCTIVE ELASTOMERIC MATERIAL ON THE SEMICONDUCTOR ELECTRODES (OR ALTERNATELY ON THE MATING ELECTRODES) TO FORM BUMPS HAVING A DESIRED SIZE AND SHAPE.

STEP E. SEMI CURE THE ADHESIVE MATRIX MATERIAL.

STEP F. ALIGN AND PLACE THE BUMPS AND THE MATING ELECTRODES IN PHYSICAL CONTACT.

STEP G. CURE THE BUMPS, AND PENETRATE THE MATING ELECTRODES WITH THE DENDRITIC PARTICLE MATERIAL, USING AN ADHESIVE FORCE GENERATED BY THE ADHESIVE MATRIX MATERIAL.

FIGURE 1

METHOD FOR FABRICATING ELECTRONIC ASSEMBLIES USING SEMI-CURED CONDUCTIVE ELASTOMERIC BUMPS

FIELD OF THE INVENTION

This invention relates generally to the fabrication of electronic assemblies that include semiconductor components, such as dice and packages. More particularly, this invention relates to an improved method for fabricating bumped electronic assemblies using semi cured conductive elastomeric bumps.

BACKGROUND OF THE INVENTION

Semiconductor dice include patterns of bond pads in electrical communication with integrated circuits contained on the dice. Bumped semiconductor dice include solder bumps formed on the bond pads. The solder bumps allow the dice to be flip chip mounted to substrates, such as printed circuit boards, to form multi chip modules and other electronic assemblies. Other semiconductor components, such as chip scale packages, can also include solder bumps which allow electrical connections to be made to the packages.

Different fabrication processes have been developed by semiconductor manufacturers for forming solder bumps. A typical wafer-level fabrication process utilizes solder wettable pads deposited on aluminum bond pads. The wafer can include a passivation layer, such as BPSG glass, having openings on which the solder wettable pads are formed. Typically, the pads include an adherence layer, such as chromium, which provides adherence to the bond pads and passivation layer. The adherence layer also forms a barrier to prevent the solder bumps from reacting with the bond pads. In addition to the adherence layer, the pads can include a solder wettable layer, such as copper, or other metal having a solderable metallurgy.

Typically, the pads are formed by evaporating, chemical vapor depositing, or electrodepositing the different metal layers through the openings in the passivation layer and onto the bond pads. Following deposition, the solder bumps can be reflowed at about 350° F. to melt and homogenize the bumps. The reflow process also forms the bumps into a hemispherical shape.

Metal masks, or stencils, are typically utilized for depositing the adherence and solder wettable layers onto the bond pads, and for depositing the solder bumps onto the solder wettable pads. Sometimes different masks are employed for each deposition step. For a wafer level bump fabrication process, the masks must be aligned and secured to the wafer each time using tooling fixtures. In general, aligning and securing the masks to the wafers is a time consuming and labor intensive process.

In addition, the wafer is often subjected to high temperatures during the bump fabrication process and during reflow of the solder bumps. With semiconductor components it is desirable to maintain a low thermal budget during manufacture, to prevent degradation of semiconductor devices contained on the component. Accordingly, low temperature bump fabrication processes would be advantageous in fabricating bumped semiconductor components.

Still further, vacuum deposition processes, such as evaporation, CVD and electrodeposition, require fabrication equipment used by manufacturers for other semiconductor fabrication processes. However, some metals utilized in fabricating solder bumps, particularly copper, can be contaminants to other fabrication processes. Accordingly, it would be advantageous to perform the bump fabrication process without subjecting other semiconductor fabrication processes to contaminants.

Yet another shortcoming of electronic assemblies that include conventional bumped semiconductor components is that the metals used to fabricate bumps are relatively incompressible. The bumps are thus subject to cracking due to handling and thermal stresses placed on the components and substrates.

Resilient materials such as conductive elastomers can also be used to make electrical connections between semiconductor components and mating components. The resilient materials are able to absorb stresses better than conventional solder bumps. However, conductive elastomeric bumps require relatively complicated deposition and curing processes. One procedure that must be followed to insure low resistance electrical paths through the bumps is curing the bumps under compression. Curing the bumps under compression requires the use of weights or fixtures for biasing the components together.

It would be advantageous to fabricate bumps with resilient materials, such as conductive elastomers, but with simplified deposition and curing processes. Accordingly improved methods for fabricating bumped semiconductor components, and for fabricating assemblies that include bumped components would be welcomed in the art.

SUMMARY OF THE INVENTION

In accordance with the present invention, a method for fabricating bumped semiconductor components and electronic assemblies, such as multi chip modules, is provided. The method, simply stated, comprises: forming semi cured, electrically conductive, elastomeric bumps on electrodes of a semiconductor component; placing the bumps in contact with electrodes of a mating component; and then fully curing the bumps using adhesive force generated by the semi cured material rather than externally generated forces.

A conductive adhesive material can be used to form the bumps. The conductive adhesive material comprises a resilient adhesive matrix material, and dendritic particles suspended within the adhesive matrix material. Suitable adhesive matrix materials include epoxy, silicone and rubber. Suitable dendritic particles include metal particles, such as silver, in a crystal, or snow flake, configuration.

Following an initial formulation, the conductive adhesive material can be screen printed, stenciled, or otherwise deposited on the component electrodes, to form the bumps. Alternately, the conductive adhesive material can be deposited on the electrodes of the mating component, rather than the semiconductor component. Preferably, deposition of the conductive adhesive material is performed at the wafer level, prior to singulation of the wafer into individual components. Following deposition of the conductive adhesive material, the adhesive matrix material can be placed in a semi cured, or B-stage condition. One method for semi curing the adhesive matrix material is by including a solvent in the initial formulation, and then outgassing the solvent. Depending on the solvent, heating may be required to initiate outgassing.

Following formation, the semi cured bumps can be aligned and placed in contact with the electrodes on the mating component. In a semi cured condition, the bumps provide a semi rigid structure for supporting the dendritic particles, but also have adhesive qualities to facilitate adhesive bonding to the semiconductor electrodes, and to the mating electrodes. In addition, adhesive forces generated by the adhesive matrix material allow the dendritic particles to penetrate oxide layers on the electrodes, to form low resistance electrical connections. The adhesive forces also permit the bumps to be fully cured by heating, but without requiring externally generated forces for biasing the components and compressing the bumps. Following curing, the bumps physically bond the components to one another, and provide separate electrical paths between the electrodes.

BRIEF DESCRIPTION OF THE DRAWINGS

FIG. 1 is a block diagram illustrating steps in a method for packaging semiconductor components in accordance with the invention;

DETAILED DESCRIPTION OF THE PREFERRED EMBODIMENTS

Figure 2A:
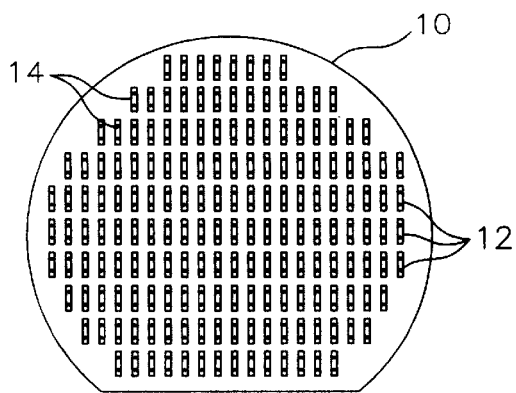
FIG. 2A is a schematic plan view of a semiconductor wafer having conductive elastomeric bumps fabricated in accordance with the invention.

Referring to FIG. 1, steps in a method for fabricating bumped semiconductor components and electronic assemblies in accordance with the invention are illustrated.

Step A. Initially, a semiconductor component is provided. As will be further explained, the component can comprise a die, a wafer or a chip scale package. In addition, the component can be provided with electrodes, such as metal bond pads, in electrical communication with integrated circuits contained on the component.

Step B. A mating component is also provided. For assembling multi chip modules, such as single in line memory modules (SIMMs), the mating component can comprise a substrate such as ceramic, silicon, or glass filled resin having a required pattern of conductors. The mating component can also comprise a printed circuit board, or a component of an electronic device, such as a computer, or field emission display device. The mating component can be provided with mating electrodes such as bonding sites on the patterns of conductors.

Step C. A conductive elastomeric material is also provided. The conductive elastomeric material includes an adhesive matrix material, a dendritic particle material and a solvent.

The adhesive matrix material can comprise an epoxy, silicone, natural rubber, synthetic rubber or similar elastomeric material having suitable adhesive characteristics. Suitable adhesive matrix materials include pthalate-acetate hydroxyl copolymer, dibutyl isobutyl diphenol cellulose copolymer, and butyl phenol ketyl vinyl acetate polymer.

The dendritic particle material can comprise metal particles embedded within the adhesive matrix material. Preferably, the dendritic particle material is configured to provide an isotropic electrically conductive path through the adhesive matrix material (e.g., electrically conductive in all directions). In addition, each dendritic particle can have a crystal, or snow flake configuration, to enable penetration of oxide layers on the semiconductor and mating component electrodes. A suitable dendritic particle material comprises dendritic silver particles having a diameter of about 5 $\mu$m. A representative proportion of the dendritic particle material expressed as a volume percentage of the total volume of the conductive elastomeric material can be from 50%–85%.

The solvent can be included in the conductive elastomeric material to facilitate semi curing of the adhesive matrix material. A suitable solvent comprises butyl carbitol acetate. A representative proportion of the solvent expressed as a volume percentage of the total volume of the conductive elastomeric material is from 5% to 7%.

Step D. Following formulation, the conductive elastomeric material can be deposited on the electrodes of the semiconductor component to form bumps of a desired size and shape. Preferably the electrodes comprise metal pads such as bond pads, or land pads, and the bumps are located within a peripheral area of the electrodes. Representative shapes for the bumps include chocolate drops, pillars, and hemispheres.

Exemplary deposition methods for the bumps include screen printing and stenciling. With screen printing a stainless steel or monofilament polyester screen can be stretched and attached to a metal frame. A negative pattern can then be generated on the mesh using a photosensitive emulsion. The conductive elastomeric material can then be forced through screen and onto the electrodes of the semiconductor component. U.S. Pat. No. 5,588,359, entitled "Method For Forming A Screen For Screen Printing A Pattern Of Small Closely Spaced Features Onto A Substrate", which is incorporated herein by reference, discloses an exemplary screen printing process. To facilitate the screen printing process the conductive elastomeric material is preferably in a liquid or viscous condition.

Another exemplary deposition method for the bumps comprises deposition of the conductive elastomeric material using a positive displacement dispensing mechanism, such as a syringe or screw dispenser apparatus. One suitable positive displacement mechanism is a "MICRO PEN" manufactured by Ohmcraft Inc. of Pittsford, N.Y. Another suitable positive displacement mechanism is a "2800" liquid dispensing system manufactured by Camelot Systems, Inc. of Haverhill, Mass. One advantage of a positive displacement mechanism is that the conductive elastomeric material can be deposited either in a liquid condition, or in a highly viscous state.

Step E. Following deposition, the conductive elastomeric material can be placed in a semi cured, or B-stage condition. As used herein, the term semi cured refers to a condition in which the adhesive matrix material is sticky and possesses adhesive qualities. In particular, the semi cured adhesive matrix material possesses sufficient adhesive qualities to form a permanent adhesive bond with the semiconductor component electrodes and mating component electrodes upon full curing. However, the semi cured adhesive matrix material also possesses a structural rigidity sufficient to support the dendritic metal particles to allow penetration of the electrodes. In addition, the semi cured adhesive matrix material is able to generate adhesive forces upon contact with the electrodes to facilitate penetration of the electrodes by the dendritic metal particles. By way of example a representative durometer for the semi cured adhesive matrix material is about 40 on the shore A scale.

An exemplary procedure for semi curing the conductive elastomeric material comprises heating to a temperature of about 25° C. 80° C. for a time period of about 60 minutes to 120 minutes to outgass the solvent.

Step F. Following semi curing, the bumps on the semiconductor component can be aligned with the electrodes on the mating component, and placed in physical contact therewith. Alignment of the bumps and electrodes on the mating component can be with an optical alignment system, or with a mechanical alignment system. For example, U.S. Pat. No. 5,634,267, entitled "Method And Apparatus For Manufacturing Known Good Semiconductor Die", which is incorporated herein by reference, discloses an optical alignment system for aligning bond pads on semiconductor dice with contacts on an interconnect. U.S. Pat. No. 5,559,444, entitled "Method And Apparatus For Testing Unpackaged Semiconductor Dice", which is incorporated herein by reference, discloses a mechanical alignment system for aligning bond pads on semiconductor dice with contacts on an interconnect.

Step G. Following contact of the bumps with the mating electrodes, the bumps can be fully cured by heating. By way of example, the bumps can be heated to a temperature of about 120° C. to 145° C. for about 10 minutes to 60 minutes.

During the curing step, contact between the bumps and mating electrodes can be maintained primarily by the adhesive force generated by the semi cured adhesive matrix, and by the weight of the components, rather than by an externally generated compressive force. As used herein, the term externally generated compressive force refers to an external force placed on the semiconductor component or mating component which functions to compress the bumps. By using semi cured bumps, weights or mechanical fixtures are not required to bias the semiconductor component and mating component together.

In particular, the adhesive force generated by the semi cured adhesive matrix functions to press the dendritic material into the electrodes. Also, the semi cured adhesive matrix provides a semi rigid structure for supporting the dendritic particle material for penetrating the electrodes. The dendritic particle material is thus able to penetrate oxide layers covering the electrodes to establish low resistance electrical connections with the underlying metal. In addition, the dendritic particle material provides an isotropic electrical path through the bumps. The cured adhesive matrix material also physically bonds the semiconductor electrodes to the mating electrodes.

Although the method has been described by forming the elastomeric bumps on the semiconductor component, it is to be understood that the method can alternately be performed by forming the elastomeric bumps on the mating electrodes of the mating component.

Figure 2B:
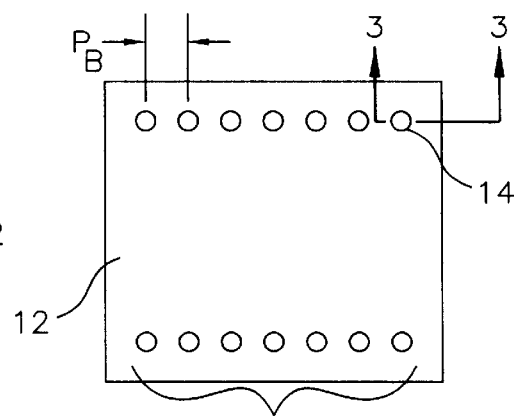
FIG. 2B is a schematic plan view of a semiconductor die which has been singulated from the wafer and includes conductive elastomeric bumps.

Referring to FIG. 2A, a semiconductor wafer 10 includes multiple semiconductor dice 12 fabricated using processes that are well known in the art. As shown in FIG. 2B, each die 12 includes one or more patterns 16 of conductive elastomeric bumps 14 fabricated using the previously outlined method of the invention.

Figure 3:
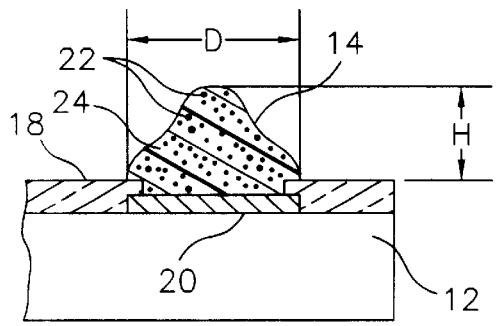
FIG. 3 is an enlarged schematic cross sectional view taken along section line 3—3 of FIG. 2B illustrating a conductive elastomeric bump.

As shown in FIG. 3, each die 12 includes a passivation layer 18, such as borophosphosilicate glass (BSPG), and multiple bond pads 20 embedded in the passivation layer 18. The bond pads 20 are in electrical communication with integrated circuits contained on the die 12, and can comprise a conventional metal such as thin film aluminum. The bumps 14 can be deposited on the bond pads 20 and then semi cured, prior to singulation of the dice 12 from the wafer 10. However, the bumps 14 can also be deposited on singulated dice and then semi cured.

FIG. 3 illustrates a single bump 14 on a singulated die 14 following semi curing of the bumps 14. Depending on the size of the bond pads 20, a representative diameter "D" of the bumps 14 can be from 2 mils to 50 mils or more. A representative height "H" of the bumps can be from 2 mils to 20 mils or more. A pitch $P_B$ of the bumps can match a pitch, or spacing, of the bond pads 20.

Figure 4B:
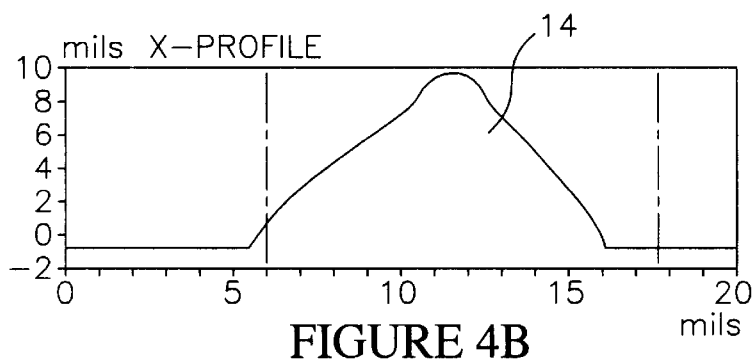
FIG. 4B is an x-profile of the elastomeric bump.
Figure 4A:
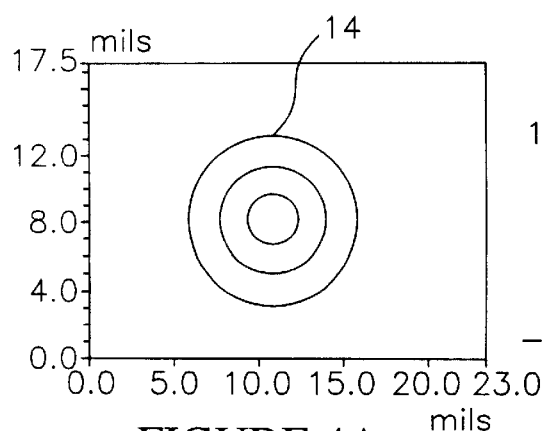
FIG. 4A is plan view profile of an elastomeric bump.
Figure 4C:
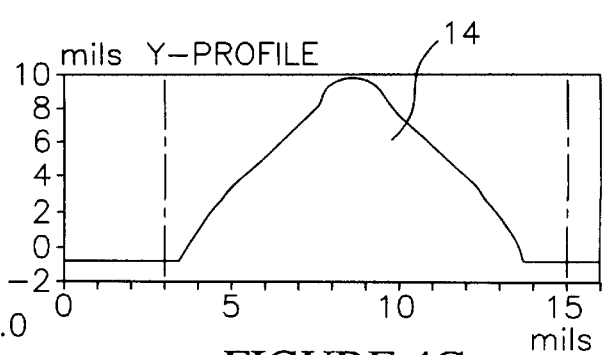
FIG. 4C is a y-profile of the elastomeric bump.

FIGS. 4A–4C illustrates an exemplary size and shape for the bumps 14. In this example the bumps 14 have a diameter "D" of about 10 mils and a height "H" of about 10 mils. A shape of the bumps 14 will be dependent on the deposition process, and on a viscosity of the conductive elastomeric material. In the example of FIGS. 4A–4C, the bumps 14 are similar in shape to a "HERSHEY'S KISSES" chocolate drop manufactured by Hershey's Chocolate of Hershey, Pa. Such a shape, as well as other similar shapes, can be achieved using a screen printing process, or using a stenciling process. Using a positive displacement deposition process, such as a syringe or a screw dispensing apparatus, the bumps 14 can be formed with a chocolate drop shape, as well as other shapes such as pillar shapes, spherical shapes, and hemispherical shapes.

Figure 3A:
FIG. 3A is an enlarged portion of FIG. 3 illustrating a dendritic metal particle within an adhesive matrix material of the conductive elastomeric bump.

The bumps 14 comprise an adhesive matrix material 24, as previously described, and a plurality of dendritic metal particles 22 embedded within the adhesive matrix material 24. As shown in FIG. 3A, the dendritic metal particles 22 can include multiple sharp asperities 26 projecting from a surface 32 of the adhesive matrix material 24. The sharp asperities 26 can be configured to penetrate oxide layers on the bond pads 20, and oxide layers on mating electrodes 28 (FIG. 6) to contact the underlying metal. This allows low resistance or "ohmic" connections to be made by the dendritic metal particles 22 to the bond pads 20, and to the mating electrodes 28. The dendritic metal particles 22 also have a density in the adhesive matrix material 24, such that each dendritic metal particle 22 touches one or more adjacent particles 22, to provide a conductive path through the adhesive matrix material 24.

Figure 5:
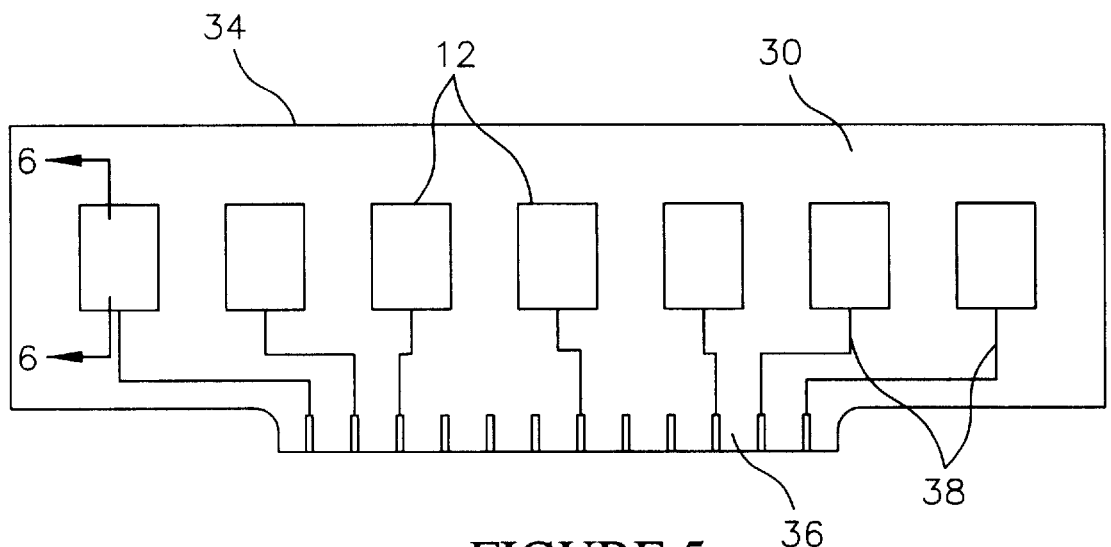
FIG. 5 is a schematic plan view of a multi chip module fabricated in accordance with the invention.
Figure 6:
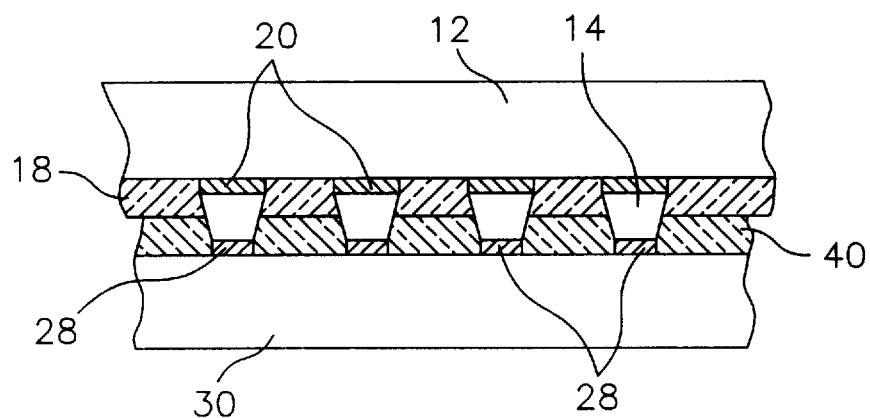
FIG. 6 is an enlarged schematic cross sectional view illustrating bonding of the elastomeric bumps on a semiconductor die to electrodes on a substrate of the module.

Referring to FIGS. 5 and 6, a multi chip module 34 assembled using the method of the invention is illustrated. The multi chip module 34 includes a substrate 30 having an edge connector 36 for electrically connecting the module 34 to another electronic device. The substrate 30 can comprise a conventional material such as ceramic, silicon, or a glass filled resin (e.g., FR-4). The edge connector 36 is in electrical communication with patterns of conductors 38 formed on the substrate 30.

The conductors 38 are in electrical communication with the electrodes 28 for the module 34. For simplicity, only one conductor 38 per die 12 is illustrated. However, each bond pad 20 (FIG. 3) on each die 12 will have at least one associated conductor 38. The conductors 38 and electrodes 28 can be formed of conventional metals (e.g., aluminum, copper, nickel) using conventional metallization processes. A pattern of the electrodes 28 on the substrate 30, matches a pattern 16 and pitch PB (FIG. 2B) of the bond pads 20 on the dice 12.

As shown in FIG. 6, the bumps 14 have been aligned and placed in contact with the electrodes 28 on the substrate 30. In addition, adhesive forces generated by the semi cured adhesive matrix material bonds the bumps 14 to the electrodes 28, and allows the dendritic metal particles 22 (FIG. 3A) to penetrate into the electrodes 28. The adhesive forces also places the bumps 14 in compression during the full curing process. Full curing of the bumps 14 solidifies the adhesive matrix material 24, and permanently bonds the bumps 14 to the bond pads 20 and to the electrodes 28.

Following full curing of the bumps 14, underfill layers 40 can be formed between the passivation layers 18 of the dice 12, and the surface of the substrate 30. The underfill layers 40 provide additional bonding and seal the gaps between the substrate 30 and the dice 12. The underfill layers 40 can be formed of a suitable material such as silicone. One suitable material for the underfill layer 40 is "HYSOL BRAND FP4520" sold by Dexter Electronic Materials. Alternately, the underfill layer 40 can be omitted.

Figure 7:
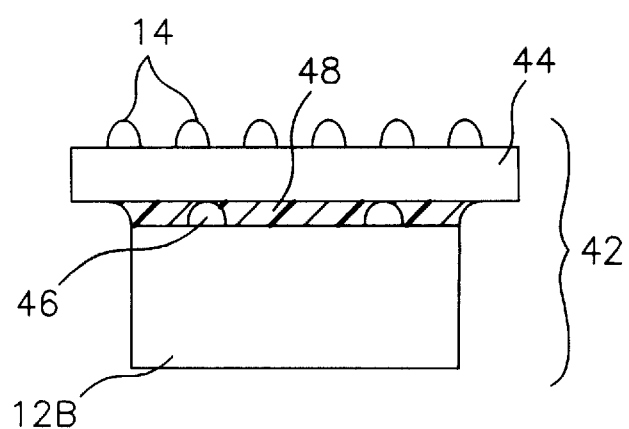
FIG. 7 is a schematic cross sectional view of a chip scale package having conductive elastomeric bumps fabricated in accordance with the invention.

Referring to FIG. 7, a chip scale package 42 fabricated in accordance with the invention is illustrated. The chip scale package 42 includes a semiconductor die 12B having bumped bond pads 46. The bumped bond pads 46 can comprise conventional solder bumps, or alternately conductive adhesive bumps. The chip scale package 42 also includes a substrate 44 having conductive elastomeric bumps 14 formed substantially as previously described. In addition, the bumps 14 can be formed in a dense array on the substrate 44, such as a ball grid array (BGA), or fine ball grid array (FBGA). An adhesive layer 48, such as silicone, bonds the bumped die 12B to the substrate 44.

In the chip scale package 42, the bumps 14 are in electrical communication with the bumped bond pads 46, and with integrated circuits contained on the bumped die 12B. In addition, the bumps 14 can be formed in a semi cured condition to permit the package 42 to be bonded to a mating component, such as the multi chip module substrate 30 previously described.

Thus the invention provides an improved method for fabricating bumped semiconductor components and electronic assemblies using semi cured conductive elastomeric bumps. The semi cured bumps provide adhesive forces, and a support structure for the dendritic particles to form low resistance electrical connections.

While the invention has been described with reference to certain preferred embodiments, as will be apparent to those skilled in the art, certain changes and modifications can be made without departing from the scope of the invention as defined by the following claims.

What is claimed is:

1. A method for fabricating an electronic assembly comprising:
    providing a first component comprising a first electrode;
    providing a second component comprising a second electrode;
    forming an electrically conductive elastomeric bump on the first electrode comprising an adhesive matrix material and a plurality of dendritic particles embedded within the adhesive matrix material;
    semi curing the bump to rigidify the adhesive matrix material while maintaining adhesive qualities thereof;
    following the semi curing step, placing the bump in physical contact with the second electrode and penetrating the second electrode with the dendritic particles using an adhesive force generated by the adhesive matrix material; and
    curing the bump.

2. The method of claim 1 wherein the semi curing step comprises outgassing a solvent from the bump.

3. The method of claim 1 wherein the first component comprises a semiconductor die or a semiconductor package, and the second component comprises an element selected from the group consisting of multi chip module substrates, printed circuit boards, and an electronic device.

4. A method for fabricating an electronic assembly comprising:
    providing a first component comprising a first electrode;
    providing a second component comprising a second electrode;
    forming an electrically conductive elastomeric bump on the first electrode comprising an adhesive matrix material and a plurality of dendritic particles embedded within the matrix material configured to provide an electrical path through the bump;
    semi curing the adhesive matrix material to a condition wherein the adhesive matrix material maintains adhesive qualities and supports the dendritic particles to enable penetration of the second electrode;
    following the semi curing step, placing the bump in physical contact with the second electrode;
    penetrating the second electrode by pressing the dendritic particles into the second electrode with an adhesive force generated by the semi cured adhesive matrix material; and
    curing the semi cured adhesive matrix material to bond the first electrode to the second electrode and form the electrical path.

5. The method of claim 4 wherein the adhesive matrix material comprises a material selected from the group consisting of epoxy, silicone, natural rubber and synthetic rubber.

6. The method of claim 4 wherein the first component comprises a semiconductor die and the second component comprises a substrate.

7. The method of claim 4 wherein the adhesive matrix material comprises a material selected from the group consisting of pthalate-acetate hydroxyl copolymer, dibutyl isobutyl diphenol cellulose copolymer, and butyl phenol ketyl vinyl acetate polymer.

8. The method of claim 4 wherein the forming step comprises a process selected from the group consisting of screen printing, stenciling, and deposition with a positive displacement apparatus.

9. A method for fabricating an electronic assembly comprising:
    providing a semiconductor component having a first electrode in electrical communication with an integrated circuit;
    providing a substrate having a second electrode;
    forming a bump on the first electrode, the bump comprising an adhesive matrix material and a plurality of dendritic particles;
    semi curing the bump to a condition wherein the adhesive matrix material maintains adhesive qualities and supports the dendritic particles to enable penetration of the second electrode;
    placing the semi cured bump in physical contact with the second electrode;
    penetrating the second electrode with the dendritic particles using an adhesive force generated by the adhesive matrix material; and
    curing the semi cured bump to provide an electrical path between the first electrode and the second electrode.

10. The method of claim 9 wherein the semi curing the bump step comprises forming the bump with a solvent and then outgassing the solvent.

11. The method of claim 10 wherein the solvent comprises butyl carbitol acetate.

12. The method of claim 9 wherein the dendritic particles comprise silver particles having a snow flake like configuration.

13. The method of claim 9 wherein the adhesive matrix material comprises a material selected from the group consisting of epoxy, silicone, natural rubber, and synthetic rubber.

14. A method for fabricating a multi chip module comprising:
providing a semiconductor die having a plurality of bond pads;
providing a substrate having a plurality of electrodes;
forming a plurality of electrically conductive elastomeric bumps on the bond pads or on the electrodes, each bump comprising an adhesive matrix material and a plurality of dendritic metal particles;
semi curing the adhesive matrix material;
aligning the bond pads with the electrodes and compressing the bumps between the bond pads and the electrodes using an adhesive force generated by the semi cured adhesive matrix material; and
curing the adhesive matrix material.

15. The method of claim 14 wherein the curing the adhesive matrix material step comprises curing without biasing the die against the substrate using an additional weight or fixture.

16. The method of claim 14 wherein the adhesive matrix material comprises a material selected from the group consisting of pthalate-acetate hydroxyl copolymer, dibutyl isobutyl diphenol cellulose copolymer, and butyl phenol ketyl vinyl acetate polymer.

17. A method for fabricating a multi chip module comprising:
providing a semiconductor wafer comprising a plurality of semiconductor dice comprising a plurality of pads;
providing a substrate comprising a plurality of electrodes;
forming a plurality of electrically conductive elastomeric bumps on at least some of the pads, each bump comprising an adhesive matrix material and a plurality of dendritic particles;
semi curing the bumps to maintain adhesive qualities thereof, and to form a semi rigid structure for supporting the dendritic particles to enable penetration of the second electrode;
separating at least one die from the wafer;
placing the bumps on the at least one die in physical contact with the electrodes on the substrate and penetrating the electrodes with the dendritic particles using an adhesive force of the adhesive material; and
following the penetrating step, curing the bumps to bond the at least one die to the substrate and form a plurality of separate electrical paths through the bumps.

18. The method of claim 17 wherein the semi curing step comprises outgassing a solvent.

19. The method of claim 17 wherein the adhesive matrix material comprises a material selected from the group consisting of epoxy, silicone, natural rubber and synthetic rubber.

20. The method of claim 17 wherein the forming step comprises a process selected from the group consisting of screen printing, stenciling and deposition with a positive displacement apparatus.

21. A semiconductor die comprising:
a pad in electrical communication with an integrated circuit on the die; and
an electrically conductive elastomeric bump on the pad, the bump comprising an adhesive matrix material and a plurality of dendritic particles embedded within the adhesive matrix material configured to provide an electrical path through the bump, the adhesive matrix material in a semi cured condition having adhesive qualities for generating an adhesive force and a structural rigidity for supporting the dendritic particles to enable penetration of a mating electrode using the adhesive force.

22. The semiconductor die of claim 21 wherein the adhesive matrix material comprises a material selected from the group consisting of epoxy, silicone, natural rubber and synthetic rubber.

23. The semiconductor die of claim 21 wherein the pad comprises a bond pad.

24. The semiconductor die of claim 21 wherein the bump has a diameter between about 2 mils to 50 mils, and a height between about 2 mils to 20 mils.

25. A semiconductor package comprising:
a semiconductor die comprising a pad;
a substrate attached to the die; and
an electrically conductive elastomeric bump on the substrate in electrical communication with the pad, the bump comprising an adhesive matrix material and a plurality of dendritic particles embedded within the matrix material configured to provide an electrical path through the bump, the adhesive matrix material in a semi cured condition having adhesive qualities for generating an adhesive force and a structural rigidity for supporting the dendritic particles to enable penetration of a mating electrode using the adhesive force.

26. The semiconductor package of claim 25 wherein the adhesive matrix material comprises a material selected from the group consisting of epoxy, silicone, natural rubber and synthetic rubber.

27. The semiconductor package of claim 25 wherein the semiconductor package comprises a chip scale package.

28. The semiconductor package of claim 25 wherein the bump has a diameter between about 2 mils to 50 mils and a height between about 2 mils to 20 mils.

29. An electronic assembly comprising:
a first component comprising a first electrode;
a second component comprising a second electrode; and
an electrically conductive elastomeric bump on the first electrode in physical and electrical contact with the second electrode, the bump comprising a semi cured adhesive matrix material and a plurality of dendritic metal particles embedded within the matrix material, the adhesive matrix material having adhesive qualities for generating an adhesive force and a rigidity for supporting the dendritic metal particles to permit penetration of the second electrode using the adhesive force.

30. The electronic assembly of claim 29 wherein the electronic assembly comprises a module.

31. The electronic assembly of claim 29 wherein the adhesive matrix material comprises a material selected from the group consisting of epoxy, silicone, and rubber.

32. The electronic assembly of claim 29 wherein the first component comprises a semiconductor die and the second component comprises a substrate.

33. The electronic assembly of claim 29 wherein the first component comprises a semiconductor die, the second component comprises a substrate, and the electronic assembly comprises a semiconductor package.

* * * * *